US007323953B2

(12) United States Patent
Yokoyama et al.

(10) Patent No.: US 7,323,953 B2
(45) Date of Patent: Jan. 29, 2008

(54) FILM BULK ACOUSTIC RESONATOR AND METHOD OF PRODUCING THE SAME

(75) Inventors: Tsuyoshi Yokoyama, Kawasaki (JP);
Takeshi Sakashita, Kawasaki (JP);
Tokihiro Nishihara, Kawasaki (JP);
Tsutomu Miyashita, Kawasaki (JP);
Yoshio Satoh, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 10/926,329

(22) Filed: Aug. 26, 2004

(65) Prior Publication Data
US 2005/0046519 A1     Mar. 3, 2005

(30) Foreign Application Priority Data
Aug. 27, 2003   (JP)   ............................. 2003-303707

(51) Int. Cl.
*H03H 9/00*   (2006.01)
(52) U.S. Cl. ........................................ 333/187; 333/189
(58) Field of Classification Search ................ 333/187, 333/189; 310/324
See application file for complete search history.

(56) References Cited

U.S. PATENT DOCUMENTS

| 5,587,620 | A | 12/1996 | Ruby et al. ................. 310/346 |
| 6,271,619 | B1 * | 8/2001 | Yamada et al. ............. 310/324 |
| 6,734,763 | B2 | 5/2004 | Nishihara et al. |
| 6,842,089 | B2 * | 1/2005 | Lee ............................. 333/189 |
| 6,906,451 | B2 | 6/2005 | Yamada et al. |
| 6,933,809 | B2 * | 8/2005 | Kyoung et al. ............. 333/193 |
| 7,212,082 | B2 * | 5/2007 | Nagao et al. ............... 333/187 |
| 2005/0099094 | A1 * | 5/2005 | Nishihara et al. ........... 310/324 |
| 2005/0264137 | A1 * | 12/2005 | Taniguchi et al. .......... 310/324 |
| 2006/0001508 | A1 * | 1/2006 | Ohara et al. ................. 333/191 |
| 2006/0066419 | A1 * | 3/2006 | Iwaki et al. ................. 333/133 |
| 2006/0091764 | A1 * | 5/2006 | Tsutsumi et al. ........... 310/324 |
| 2006/0244553 | A1 * | 11/2006 | Yokoyama et al. ......... 333/191 |
| 2006/0255693 | A1 * | 11/2006 | Nishihara et al. ........... 310/365 |
| 2007/0096597 | A1 * | 5/2007 | Taniguchi et al. .......... 310/320 |
| 2007/0115078 | A1 * | 5/2007 | Sano et al. .................. 333/187 |

FOREIGN PATENT DOCUMENTS

| JP | 6-204776 | 7/1994 |
| JP | 9-82666 A | 3/1997 |

(Continued)

OTHER PUBLICATIONS

Lanz Roman et al., Solidly Mounted BAW Filters For The 6 to 8 GHz Range Based on AIN Thin Films, 2001, IEEE Ultrasonics Symposium, pp. 843-846.*

(Continued)

*Primary Examiner*—Dean Takaoka
(74) *Attorney, Agent, or Firm*—Arent Fox LLP

(57) ABSTRACT

A film bulk acoustic resonator includes: a piezoelectric thin film that is formed on a principal surface of a substrate; and a lower electrode and an upper electrode that are arranged to sandwich the piezoelectric thin film. In this film bulk acoustic resonator, the piezoelectric thin film is made of aluminum nitride, and at least one of the lower electrode and the upper electrode contains a ruthenium or ruthenium-alloy layer.

10 Claims, 14 Drawing Sheets

FOREIGN PATENT DOCUMENTS

| | | |
|---|---|---|
| JP | 2000-69594 | 3/2000 |
| JP | 2000-244030 A | 9/2000 |
| JP | 2001-111136 A | 4/2001 |
| JP | 2001-251159 A | 9/2001 |
| JP | 2003-22074 A | 1/2003 |
| JP | 2003-152235 A | 5/2003 |
| JP | 2003-204239 A | 7/2003 |
| KR | 2003-0035784 | 5/2003 |
| KR | 2003-0060809 | 7/2003 |
| WO | 99/66558 A1 | 12/1999 |

OTHER PUBLICATIONS

Lee Hwan-Chul et al., Influence of sputtering pressure on the microstructure evolution of AlN thin films prepared by reactive sputtering, 1995, Elsevier Science S.A., pp. 148-153.*

Won, Seok-Jun et al., Conformal CVD-Ruthenium Process for MIM Capacitor in Giga-bit DRAMs, IEEE 2000, 4 pages.*

Iriarte, Gonzalo Fuentes, AlN Thin Film Electroacoustic Devices, Uppsala, Mar. 2003, 13 pages.*

* cited by examiner

FILM BULK ACOUSTIC RESONATOR AND METHOD OF PRODUCING THE SAME

BACKGROUND OF THE INVENTION

1. Field of the Invention

The present invention generally relates to a film bulk acoustic resonator and a method of producing the film bulk acoustic resonator, and more particularly, to a film bulk acoustic resonator that has a cavity formed by performing etching with a fluorine-based gas and a method of producing the film bulk acoustic resonator.

2. Description of the Related Art

As mobile communication devices such as portable telephone devices have rapidly become common in recent years, there is an increasing demand for small-sized, lightweight filters formed with devices such as surface acoustic wave (SAW) devices. Especially, having sharp cut-off characteristics and being small and light, surface acoustic wave filters (hereinafter referred to as SAW filters) are being widely used as the RF (Radio Frequency) filters and the IF (Intermediate Frequency) filters of portable telephone devices.

A SAW filter includes a piezoelectric substrate and interdigital transducers (IDTs) formed on a principal surface of the piezoelectric substrate. When an AC voltage is applied to the IDTs, acoustic wave of a certain frequency band is excited on the surface of the piezoelectric substrate.

When a high voltage is applied to the IDTs in such a SAW filter, the IDTs physically break due to deformation of the substrate caused by the acoustic wave. This problem becomes more conspicuous with IDTs having a narrower electrode finger width, i.e., with a higher-frequency filter.

In view of this, SAW filters have the problem of low power resistance, and are difficult to be used as the front-end filters of an antenna duplexer.

To counter this problem, film bulk acoustic resonators (hereinafter referred to as FBARs) have been developed as useful means for forming filters that are resistant to a large amount of power. A FBAR includes a substrate, a piezoelectric thin film, lower and upper electrodes that are metal thin films sandwiching the piezoelectric thin film, and a cavity that is formed under the lower electrode in contact with the substrate. When a potential difference is caused between the upper electrode and the lower electrode in this structure, the piezoelectric thin film sandwiched between the upper electrode and the lower electrode vibrates in the thickness direction by virtue of a piezoelectric effect, thereby showing electric resonance characteristics.

FBARs with such characteristics can be connected in a ladder-like fashion to form a bandpass filter. At present, FBAR filters represented by such a bandpass filter are known to have much greater power durability than SAW filters.

A bandpass filter is required to have low loss in the pass band and to exhibit a high degree of suppression in the stop band. In view of this, the electrode material to be used for the upper electrode and the lower electrode becomes an important factor in producing a bandpass filter with FBARs.

It is essential for an electrode material to have low resistance and high acoustic impedance. The following electrode structures have been suggested to date.

U.S. Pat. No. 5,587,620 (Patent Document 1) discloses an electrode structure that uses molybdenum (Mo) as the electrode material. A film made of molybdenum (Mo) has low resistance and high acoustic impedance. Accordingly, excellent resonance characteristics can be obtained by using a molybdenum film in a film bulk acoustic resonator.

However, molybdenum is easily etched with a fluorine-based gas or an acid-based chemical, and therefore, narrows the variation of the methods of forming a cavity under the lower electrode.

Japanese Patent Application Publication No. 6-204776 (Patent Document 2) discloses one of the methods of forming a cavity under the lower electrode. By this method, anisotropic etching with KOH solution or the like is performed on a single-crystal silicon substrate, so as to form a through hole from the bottom surface of the substrate. Molybdenum. (Mo) cannot be etched with a KOH solution. Accordingly, the lower electrode containing molybdenum (Mo) as the electrode material is not damaged, and a cavity can be easily formed.

Japanese Patent Application Publication No. 2000-69594 discloses another method of forming a cavity under the lower electrode. By this method, a sacrifice layer is deposited in a concavity formed on a substrate. After a lower electrode, a piezoelectric thin film, and an upper electrode are formed, the sacrifice layer is removed. More specifically, a concavity is formed by etching the surface of a silicon (Si) substrate in the first step. In the second step, a thermal oxide film is formed on the surface of the silicon substrate to prevent phosphorus contained in PSG (phosphosilicate glass) to be used as a sacrifice layer from diffusing into the silicon substrate. After the formation of the thermal oxide film, PSG is deposited to form the sacrifice layer in the third step. In the fourth step, mirror finishing is performed on the surface of the deposited sacrifice layer through polishing and cleaning, thereby removing the part of the sacrifice layer outside the concavity. On the surface of the silicon substrate including the sacrifice layer that is exposed through the same plane as the surface of the silicon substrate, a lower electrode, a piezoelectric thin film, and an upper electrode are deposited in this order in the fifth step. In the sixth step, which is the last step, the sacrifice layer is removed to form a cavity under the lower electrode. The removal of the sacrifice layer (the PSG layer) in the sixth step can be carried out with a diluted $H_2O$:HF solution, for example. In this manner, PSG can be etched at a very high etching rate. Accordingly, the cavity can be formed under the lower electrode even though molybdenum (Mo) is used as the electrode material.

The substrate having a through hole formed by the method disclosed in Patent Document 2, however, is very poor in mechanical strength. Because of this, the production yield is low, and it is very difficult to perform the wafer dicing procedure and the package mounting procedure. Furthermore, the through hole formed by anisotropic etching has a tilt angle of approximately 55 degrees. Because of this, it is difficult to connect resonators close to one another in a ladder-like fashion. As a result, a small-sized device cannot be realized.

The method disclosed in Patent Document 3 involves a large number of production procedures, and, by this method, it is difficult to produce a device at a low production cost. Furthermore, the polishing procedure causes problems such as slurry remnants. As a result, the production yield becomes lower.

SUMMARY OF THE INVENTION

It is therefore an object of the present invention to provide a film bulk acoustic resonator and a method of producing the film bulk acoustic resonator in which the above disadvantages are eliminated.

A more specific object of the present invention is to provide a film bulk acoustic resonator that is easy to produce with a high yield, less expensive, and smaller, and has excellent characteristics. Another specific object of the present invention is to provide a method of producing such a film bulk acoustic resonator.

The above objects of the present invention are achieved by a film bulk acoustic resonator comprising: a piezoelectric thin film formed on a first surface of a substrate; and a lower electrode and an upper electrode arranged to sandwich the piezoelectric thin film, the piezoelectric thin film being made of aluminum nitride, and at least one of the lower electrode and the upper electrode containing a ruthenium or ruthenium-alloy layer.

The above objects of the present invention are also achieved by a method of producing a film bulk acoustic resonator, comprising the steps of: forming a lower electrode on a substrate; forming a piezoelectric thin film of aluminum nitride on the substrate in such a manner as to cover the lower electrode; and forming an upper electrode on the piezoelectric thin film, the lower electrode containing a ruthenium or ruthenium-alloy layer.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of preferred embodiments of the present invention, with reference to the accompanying drawings.

Figure 1A:
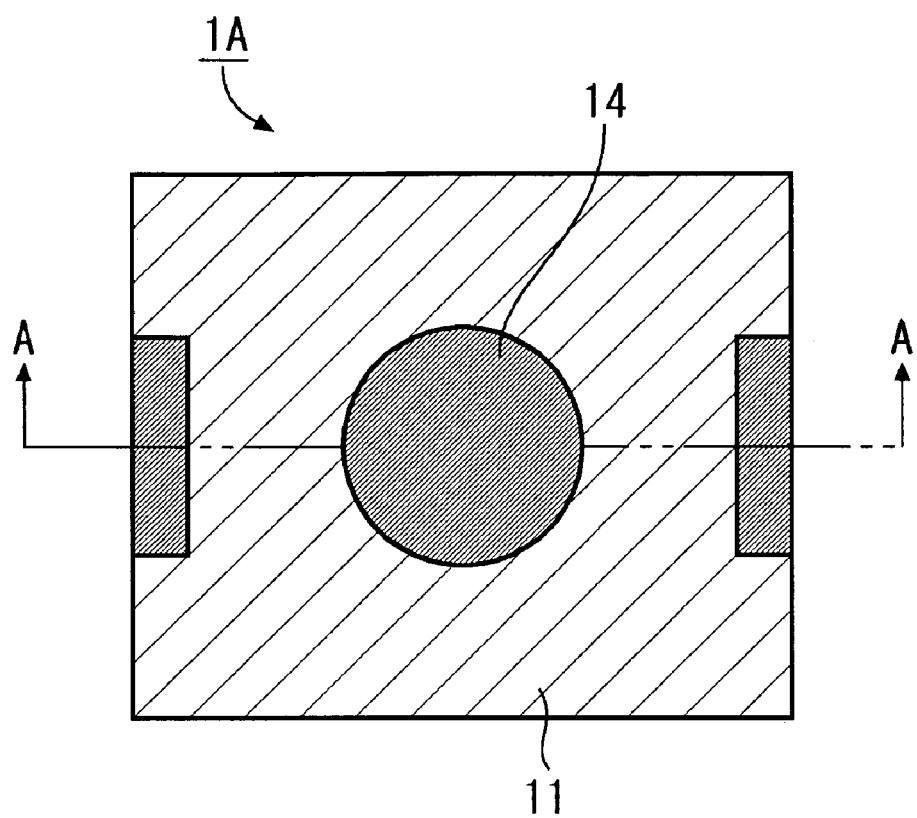
FIG. 1A is a plan view of a FBAR in accordance with a first embodiment of the present invention.
Figure 1B:
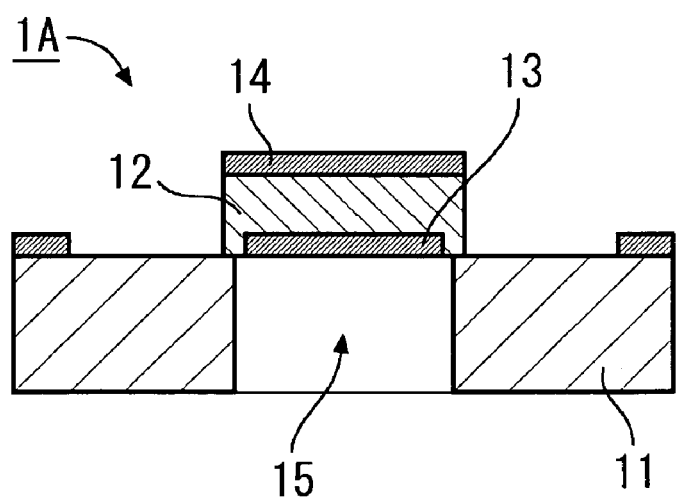
FIG. 1B is a section view of the FBAR, taken along the line A-A of FIG. 1A.

First, a first embodiment of the present invention is described in detail. FIGS. 1A and 1B illustrate the structure of a film bulk acoustic resonator (FBAR) 1A in accordance with this embodiment. FIG. 1A is a plan view of the FBAR 1A, and FIG. 1B is a section view of the FBAR 1A, taken along the line A-A of FIG. 1A.

As shown in FIGS. 1A and 1B, the FBAR 1A has a piezoelectric thin film 12 formed on a principal surface of a substrate 11. The substrate 11 is a silicon (Si) substrate, for example. In a region to form a resonator in the piezoelectric thin film 12, a lower electrode 13 and an upper electrode 14 are formed in such a manner as to sandwich the piezoelectric thin film 12 from the top and the bottom. The substrate 11 has a cavity 15 formed inside, and the entire surface of the lower electrode 13 faces the cavity 15. The cavity 15 serves to prevent interruption of the vibration of the piezoelectric thin film 12 when a high-frequency signal is applied to the lower electrode 13 and the upper electrode 14.

So as to achieve excellent resonance characteristics and to simplify the production process of this structure, the piezoelectric thin film 12, and the lower electrode 13 and the upper electrode 14 that sandwich the piezoelectric thin film 12 are formed in the following manner.

The piezoelectric thin film 12 is made of lead titanate ($PbTiO_3$), PZT, aluminum nitride (AlN), or the like, but it is more preferable to employ an AlN thin film. This is because $PbTiO_3$ and PZT has many components (containing three elements or more), and the lead (Pb) contained in those materials diffuses. Therefore, composition control is very difficult, and mass production cannot be efficiently performed. On the other hand, AlN has only two elements, and does not contain lead that diffuses. Accordingly, by employing an AlN thin film, the production process can be simplified, and a higher yield can be achieved.

In this embodiment, the ratio d1/d2 of the total film thickness d1 of the lower electrode 13 and the upper electrode 14 to the film thickness d2 of the piezoelectric thin film 12 is restricted to the range of 1/12 to 1, so that the pass frequency band of the FBAR 1A is within the frequency band of 100 MHz to 10 GHz.

A fluorine-based gas or an acid-based chemical that is suitable for etching AlN (the piezoelectric thin film 12) and silicon (the substrate 11) is normally used to pattern the piezoelectric thin film 12 and to form the cavity 15. However, some of the electrode materials that are normally used, such as molybdenum, are not resistant to fluorine-based gases and acid-based chemicals, and are easily etched with such agents. To counter this problem, this embodiment employs ruthenium or ruthenium alloy as an electrode material that is resistant to fluorine-based gases and acid-based chemicals, and at least either the lower electrode 13 or the upper electrode 14 includes a ruthenium of ruthenium-alloy thin-film layer. More specifically, one or both of the lower electrode 13 and the upper electrode 14 are formed with a ruthenium or ruthenium-alloy single-layer film. Alternatively, one or both of the lower electrode 13 and the upper electrode 14 are formed with a multi-layer film that includes a ruthenium or ruthenium-alloy film.

Ruthenium alloy is a material containing ruthenium as a main component. Examples of ruthenium alloys includes an alloy of ruthenium containing approximately 2% of copper (Cu), an alloy of ruthenium containing approximately 2% of aluminum (Al), and an alloy of ruthenium containing approximately 2% of chromium (Cr).

The resistance of the lower electrode 13 and the upper electrode 14 contributes to resonance characteristic loss, and the acoustic impedance of the lower electrode 13 and the upper electrode 14 contributes to anti-resonance characteristic loss. Therefore, the inventors have discovered the following conditions for the lower electrode 13 and/or the upper electrode 14 to obtain excellent resonance characteristics and anti-resonance characteristics.

First, the resistivity of the lower electrode 13 and the upper electrode 14, which causes input signal loss, is controlled to be 50 $\mu\Omega\cdot cm$ or lower. By meeting this condition, loss of input signals that are high-frequency signals can be reduced, and excellent resonance characteristics can be obtained. The lower limit of the resistivity can be set at 1 $\mu\Omega\cdot cm$, for example.

The acoustic impedance of the lower electrode 13 and the upper electrode 14 needs to be large so as to obtain excellent anti-resonance characteristics. Here, the acoustic impedance is represented by the square root of the product of an elastic modulus and a density. This implies that a film with a high elastic modulus exhibits high acoustic impedance. In view of this, an electrode film with a great elastic modulus is used for the lower electrode 13 and the upper electrode 14, so as to obtain a resonator with excellent anti-resonance characteristics. For example, the lower electrode 13 and/or the upper electrode 14 is formed with an electrode film with an elastic modulus of $4\times10^{11}$ N/m or greater, so as to obtain excellent anti-resonance characteristics.

Ruthenium or ruthenium alloy used in this embodiment has a smaller resistivity and higher acoustic impedance than electrode materials that are generally used. Accordingly, the above described condition can be easily met with a ruthenium or ruthenium-alloy electrode film. In this embodiment, at least one of the lower electrode 13 and the upper electrode 14 is formed with an electrode film containing a film made of at least one of ruthenium or ruthenium alloy, so that a FBAR with excellent resonance characteristics and anti-resonance characteristics can be obtained.

Where AlN is used for the piezoelectric thin film 12, however, it is essential for the AlN film to exhibit a (002)-orientation to obtain excellent resonance characteristics. The orientation of the lower electrode 13 plays an important role in making the piezoelectric thin film 12 exhibit a (002)-orientation. This is because the orientation of the lower electrode 13 greatly affects the orientation of the piezoelectric thin film 12, as the piezoelectric thin film 12 is formed on the lower electrode 13. Therefore, the lower electrode 13 is orientated in the (002) direction as the principal orientation axis, like the piezoelectric thin film 12. By doing so, an AlN thin film with excellent (002)-orientation can be obtained.

As shown in FIG. 1B, the cavity 15 is formed under the lower electrode 13. The substrate 11 that is used as the base for the lower electrode 13 and the piezoelectric thin film 12 is etched with a fluorine-based gas or an acid-based chemical such as buffered hydrofluoric acid, as described earlier.

On the other hand, ruthenium and ruthenium alloy are very resistant to fluorine-based gases and acid-based chemicals. Accordingly, the lower electrode 13 containing a ruthenium or ruthenium-alloy film cannot be etched, and the FBAR 1A can be smoothly produced.

Particularly, a fluorine-based gas is used in a case where the substrate 11 is a silicon substrate and dry etching in the direction perpendicular to the principal surface of the substrate 11 is performed on the substrate 11 (so as to form the side faces of the cavity 15 in the direction substantially perpendicular to the principal surface of the substrate 11). In such a case, the formation of the cavity 15 can be facilitated by employing a ruthenium or ruthenium-alloy electrode film for the lower electrode 13. Thus, a yield decrease due to etching of the lower electrode 13 can be prevented.

As described above, ruthenium and ruthenium alloy are resistant to fluorine-based gases and acid-based chemicals, and therefore, it is not necessary to perform anisotropic etching using KOH solution or the like to form the cavity 15 in the substrate 11. Instead, dry etching using a fluorine-based gas can be performed so as to form the side faces of the cavity 15 in the direction substantially perpendicular to the principal surface of the substrate 11. Accordingly, resonators can be positioned closer to one another than in a case where anisotropic etching is performed to form the side faces of the cavity 15 diagonally with respect to the principal surface of the substrate 11. As a result, the entire device can be made smaller. Furthermore, this structure does not require the step of forming a sacrifice layer for forming the cavity 15 and the step of polishing the sacrifice layer. Thus, the production process can be simplified, and the production cost can be reduced.

In a case where a sacrifice layer is formed in the substrate 11 in advance and the cavity 15 is formed by removing the sacrifice layer after the formation of the lower electrode 13, the piezoelectric thin film 12, and the upper electrode 14 on the substrate 11, an electrode film containing ruthenium or ruthenium alloy can also prevent etching of the lower electrode 13. Thus, a yield decrease can be prevented, and smooth device production can be realized. Also, in a case where wet etching is performed to pattern the piezoelectric thin film 12, an electrode film containing ruthenium or ruthenium alloy cannot be etched. Thus, a yield decrease can be prevented, and smooth device production can be realized. Further, in a case where dry etching is performed to pattern the piezoelectric thin film 12, the same effects as above can be achieved.

In this embodiment, the cavity 15 needs to have such a size as to expose the lower electrode 13 entirely. Therefore, the portion of the substrate 11 located under the lower electrode 13 is completely removed by etching. Thus, the substrate 11 can be prevented from hindering excitation. Here, the piezoelectric thin film 12 needs to be larger than the cavity 15, so as to firmly stay on the substrate 11.

Next, a method of producing the FBAR 1A in accordance with this embodiment is described in detail. In the example case described below, the upper electrode 14 is formed as a single-layer film of ruthenium (Ru), the lower electrode 13 is formed as a multi-layer film of molybdenum (Mo) and aluminum (Al), with molybdenum being on top of aluminum, the piezoelectric thin film 12 is made of aluminum nitride (AlN), and the substrate 11 is a silicon substrate.

Figure 2A:
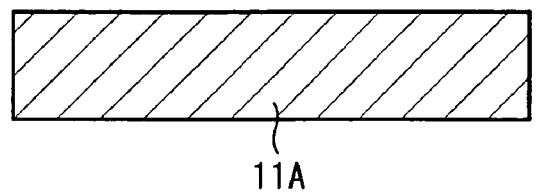
FIGS. 2A through 2E illustrate a method of producing the FBAR in accordance with the first embodiment of the present invention.
Figure 2B:
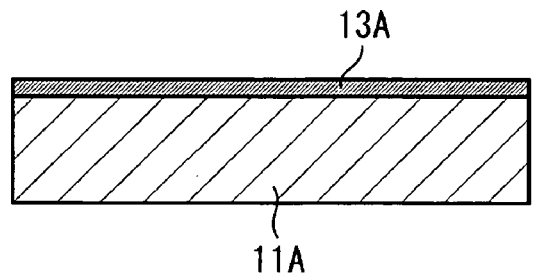

First, a silicon substrate 11A is prepared as shown in FIG. 2A. A conductive film 13A to be formed into the lower electrode 13 by patterning is formed on a principal surface of the silicon substrate 11A by a sputtering technique or the like, as shown in FIG. 2B. This conductive film 13A has a multi-layer structure having a 50 nm aluminum film formed on the silicon substrate 11A and a 100 nm molybdenum film formed on the aluminum film.

Figure 2C:
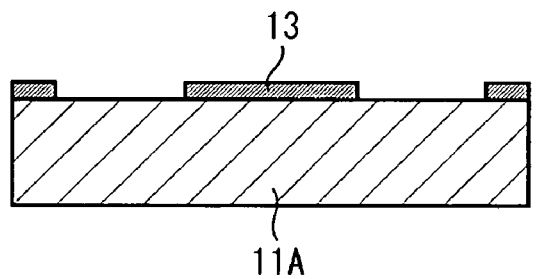

A resist film with a predetermined shape (to form the lower electrode 13) is then formed on the conductive film 13A by a photolithography technique or the like, and patterning is performed thereon by dry etching or wet etching to form the lower electrode 13 with a desired shape, as shown in FIG. 2C. Here, other wiring patterns and a ground pattern may be formed at the same time. In the dry etching or wet etching, a fluorine-based gas or an acid-based chemical can be used as mentioned earlier.

Figure 2D:
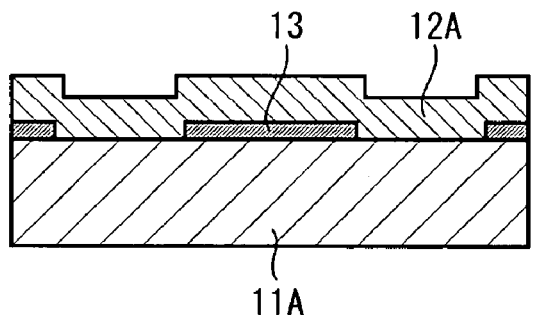
Figure 2E:
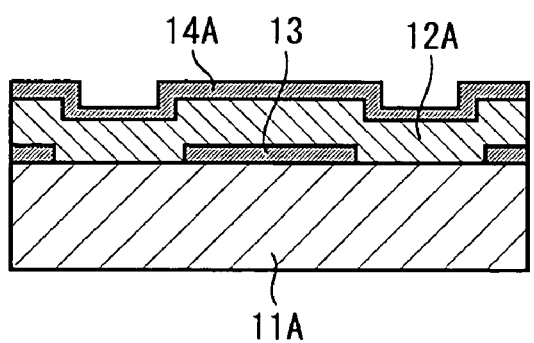

Next, a piezoelectric thin film 12A is formed on the lower electrode 13 and the silicon substrate 11A by a sputtering technique or the like, as shown in FIG. 2D. Further, a conductive layer 14A to be formed into the upper electrode 14 by patterning is formed on the piezoelectric thin film 12A by a sputtering technique or the like, as shown in FIG. 2E. The piezoelectric thin film 12A is a 500 nm aluminum nitride (AlN) film, for example. The conductive layer 14A has a single-layer structure having a 100 nm ruthenium (Ru) film formed on the piezoelectric thin film 12A, for example.

Figure 3A:
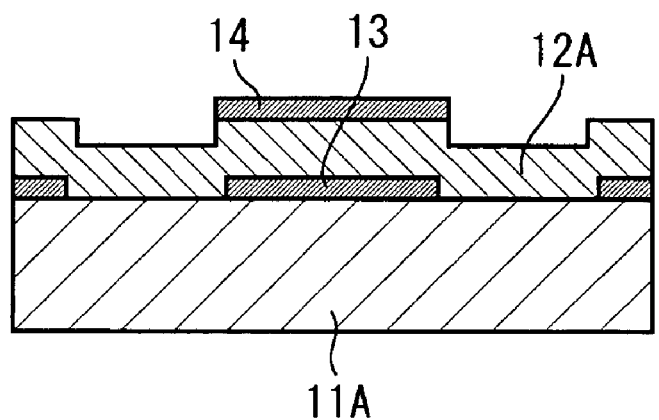
FIGS. 3A through 3C illustrate the method of producing the FBAR in accordance with the first embodiment of the present invention.
Figure 3B:
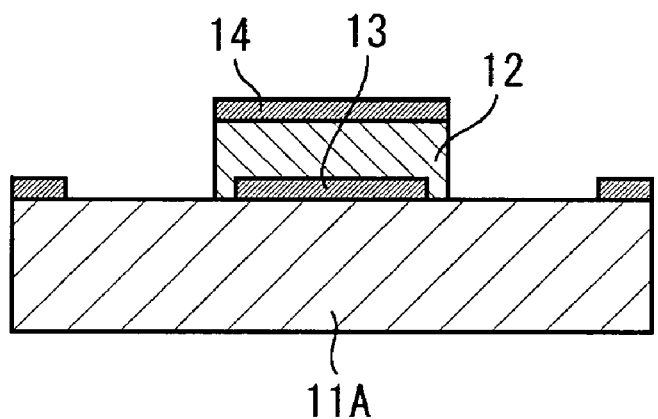

A resist film with a predetermined shape (to form the upper electrode 14 and the piezoelectric thin film 12) is then formed on the conductive layer 14A by a photolithography technique or the like, and patterning is performed by dry etching or wet etching to form the upper electrode 14 (see FIG. 3A) and the piezoelectric thin film 12 (see FIG. 3B) with the desired shapes. Here, a fluorine-based gas or an acid-based chemical can be used in the dry etching or wet etching. In this procedure, lift-off may be performed to form the upper electrode 14.

Figure 3C:
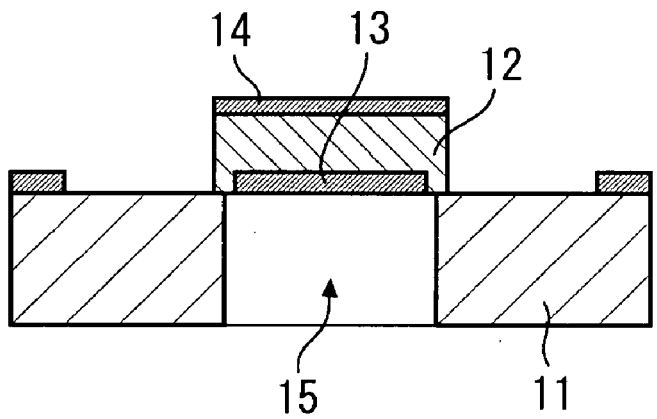

After a resonator including the lower electrode 13, the piezoelectric thin film 12, and the upper electrode 14 is formed in the above described manner, a resist film with a predetermined shape (to form the cavity 15) is formed on the bottom surface of the silicon substrate 11A by a photolithography technique or the like. Dry etching is then performed on the resist film to produce the substrate 11 with the cavity 11 formed therein. Thus, the FBAR 1A shown in FIGS. 1A, 1B, and 3C is obtained.

In forming the cavity 15, etching with $CF_6$, which is a fluorine-based gas, and formation of a side-wall protection film of $C_4F_8$ are alternately repeated, so that the side faces of the cavity 15 become substantially perpendicular to the bottom surface of the silicon substrate 11A. However, some other method may be employed to form the cavity 15.

In the above described method, the ruthenium or ruthenium-alloy layer contained in the lower electrode 13 and/or the upper electrode 14 may be formed by some other technique than the sputtering technique, such as a vacuum vapor deposition technique, a wet etching technique, an ion milling technique, a reactive ion etching using a gas containing oxygen, or a combination of two or more of those techniques. In the case of employing the wet etching technique, nitric acid or cerium diammonium nitrate can be used as the etching liquid.

Figure 4:
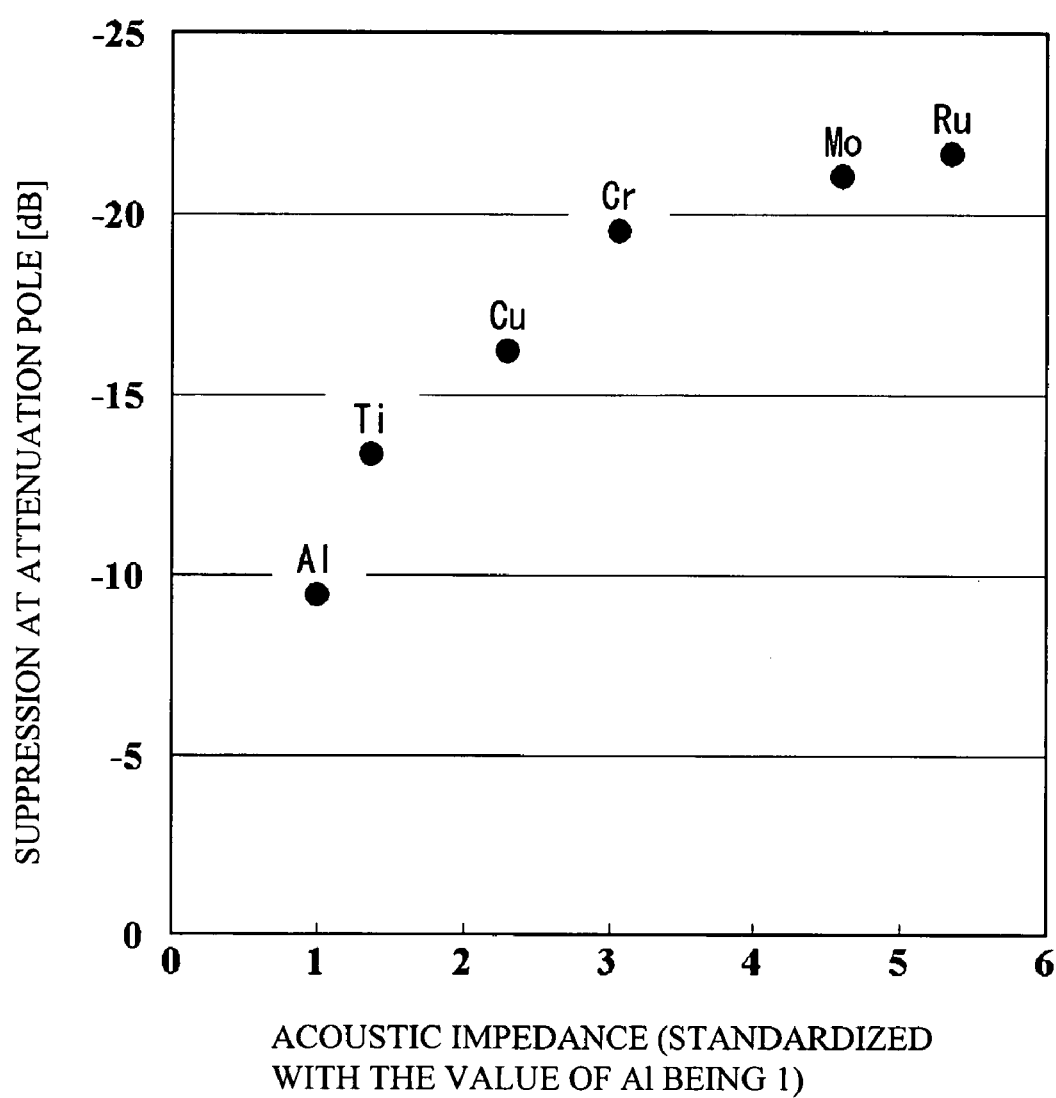
FIG. 4 shows the degree of suppression at the attenuation pole of the FBAR in accordance with the first embodiment of the present invention.

FIG. 4 shows the degree of suppression at the attenuation pole of each FBAR 1A produced by the above production method. In the examples shown in FIG. 4, the resonance frequency is 5 GHz, the excitation-area cross sections of the lower electrode 13 and the upper electrode 14 (i.e., the cross sections on planes parallel to the principal surface of the substrate 11) have circular shapes, and the radius of each of the cross sections is 80 μm. The electrode materials for the upper electrode 14 are aluminum (Al), titanium (Ti), copper (Cu), chromium (Cr), molybdenum (Mo), and ruthenium (Ru). FIG. 4 shows the degree of suppression at the attenuation pole observed with each of those electrode materials.

As can be seen from FIG. 4, the resonance characteristics of the FBAR 1A greatly vary with the electrode material of the upper electrode 14. More specifically, when the upper electrode 14 is made of an electrode material with high acoustic impedance, the degree of suppression at the attenuation pole is also high. Accordingly, a FBAR with excellent resonance characteristics can be produced by employing ruthenium with high acoustic impedance as the electrode material.

Figure 5:
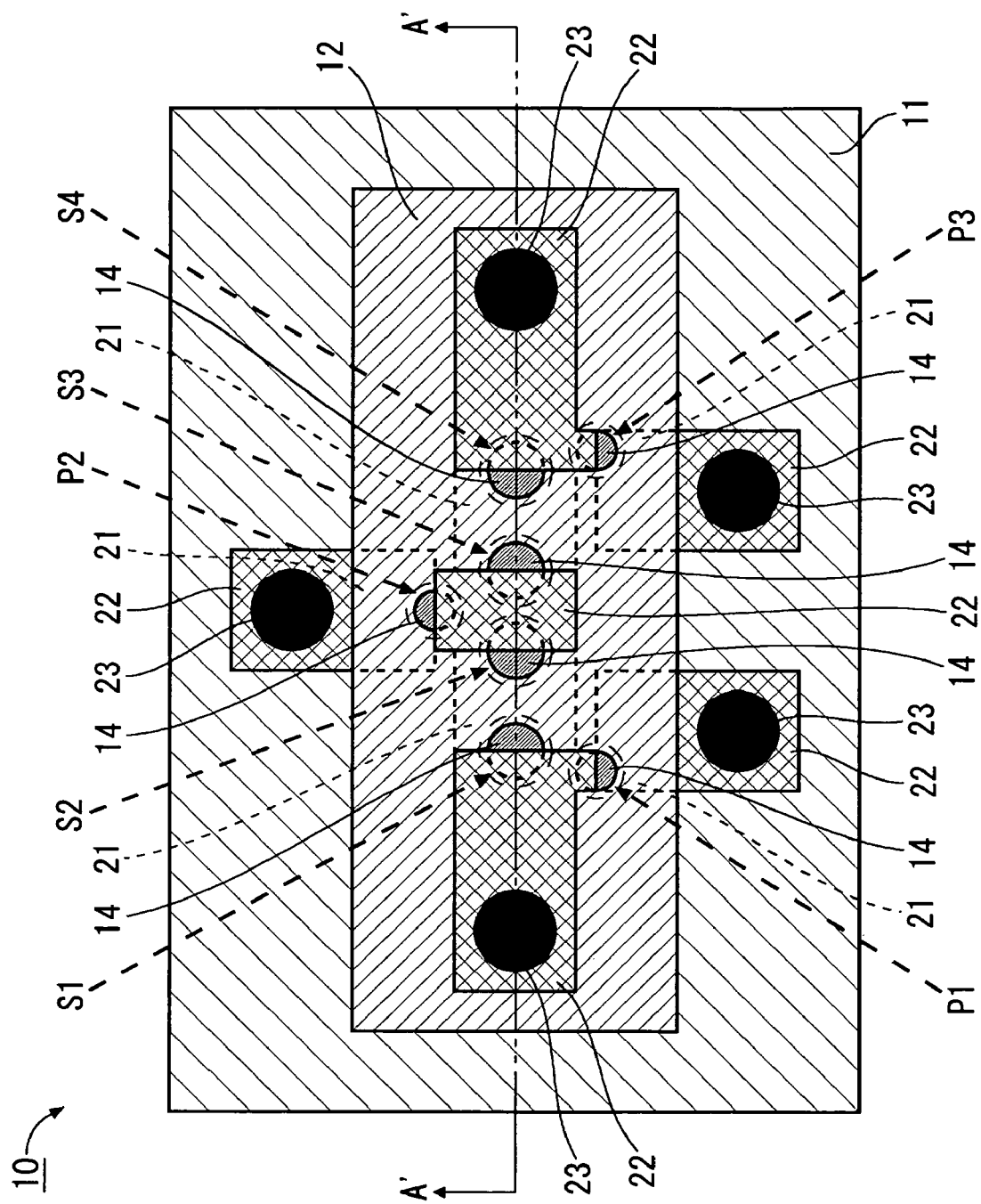
FIG. 5 is a plan view of a bandpass filter in accordance with the first embodiment of the present invention.
Figure 6:
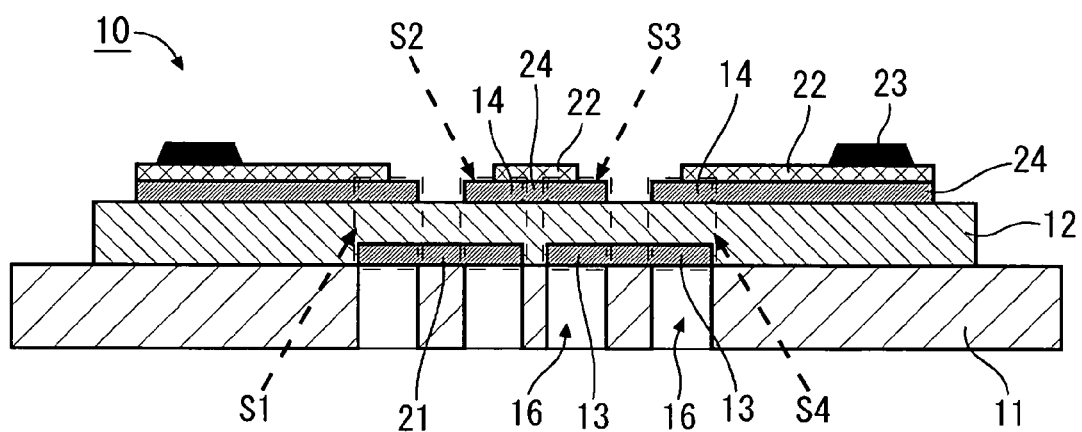
FIG. 6 is a section view of the bandpass filter, taken along the line A'-A' of FIG. 5.
Figure 7:
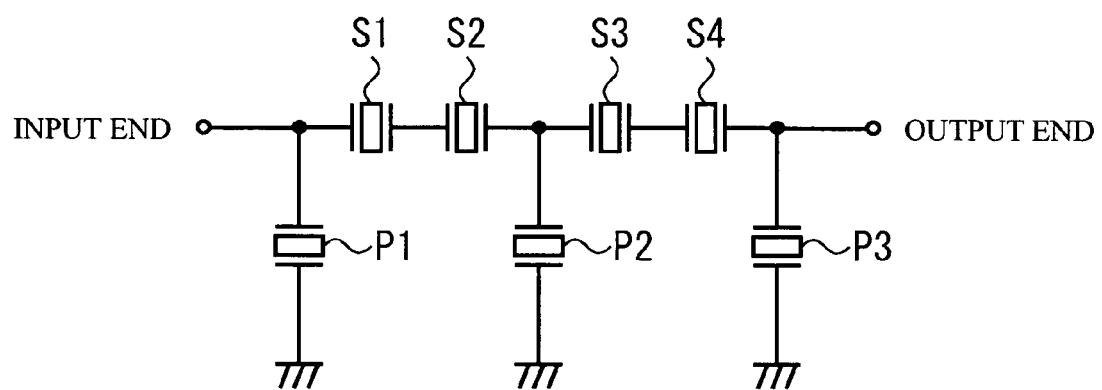
FIG. 7 is an equivalent circuit representation of the bandpass filter 10 shown in FIGS. 5 and 6.

Next, a bandpass filter 10 that employs FBARs 1A of this embodiment is described in detail. FIG. 5 is a plan view of the bandpass filter 10 in accordance with this embodiment. FIG. 6 is a section view of the bandpass filter 10, taken along the line A'-A' of FIG. 5. FIG. 7 is an equivalent circuit representation of the bandpass filter 10 shown in FIGS. 5 and 6.

As shown in FIGS. 5 and 7, the bandpass filter 10 includes four resonators S1 through S4 that are arranged on a series arm (hereinafter referred to as the series-arm resonators S1 through S4), and three resonators P1 through P3 that are arranged on parallel arms (hereinafter referred to as the parallel-arm resonators P1 through P3). Each of the series-arm resonators S1 through S4 and the parallel-arm resonators P1 through P3 has the same structure as the FBAR 1A shown in FIGS. 1A and 1B.

The upper electrode 14 of each of the series-arm resonators S1 and S4 provided at the input end and the output end of the bandpass filter 10 is connected to a wire 24. A bump connecting pad 22 that has a laminated structure of a metal layer and a titanium layer, for example, is formed on each wire 24. A metal bump 23 is formed on each bump connecting pad 22, and is designed to be connectable to a signal output terminal or a signal input terminal on the die-attach surface of a package (not shown). The bandpass filter 10 is face-down bonded to the die-attach surface of the package.

The wire 24 between the input end and the series-arm resonator S1 branches out and is also connected to the upper electrode 14 of the parallel-arm resonator P1. The lower electrode 13 of the parallel-arm resonator P1 is connected to a wire 21 that extends to a region outside the piezoelectric thin film 12. The same bump connecting pad 22 as above is formed on the wire 21 in the region outside the piezoelectric thin film 12, and is designed to be connectable to a ground terminal on the die-attach surface. Likewise, the wire 24 between the output end and the series-arm resonator S4 branches out and is also connected to the upper electrode 14 of the parallel-arm resonator P3. The lower electrode 13 of the parallel-arm resonator P3 is connected to a wire 21 that extends to a region outside the piezoelectric thin film 12. The same bump connecting pad 22 as above is formed on the wire 21 in the region outside the piezoelectric thin film 12, and is designed to be connectable to a ground terminal on the die-attach surface.

The lower electrodes 13 of the series-arm resonators S1 and S2 are connected to each other via the corresponding wire 21. Likewise, the lower electrodes 13 of the series-arm resonators S3 and S4 are connected to each other via the corresponding wire 21. Also, the upper electrodes 14 of the series-arm resonators S2 and S3 are connected to each other via the corresponding wire 24.

The wire 24 connecting the series-arm resonators S2 and S3 also branches out and is connected to the upper electrode 14 of the parallel-arm resonator P2. The lower electrode 13 of the parallel-arm resonator P2 is connected to a wire 21 that extends to a region outside the piezoelectric thin film 12.

The same bump connecting pad 22 as above is formed on the wire 21 in the region outside the piezoelectric thin film 12, and is designed to be connectable to a ground terminal on the die-attach surface.

As described above, with the FBARs 1A of this embodiment, the bandpass filter 10 that exhibits small insertion loss and excellent filter characteristics can be obtained.

In the above described example, the piezoelectric thin film 12 may be made of zinc oxide (ZnO), instead of AlN. Also, the lower electrode 13 and the upper electrode 14 may be made of iridium (Ir) or iridium alloy, or rhodium (Rh) or rhodium alloy, instead of ruthenium or ruthenium alloy.

Second Embodiment

Next, a second embodiment of the present invention is described. In the above described first embodiment, at least one of the lower electrode 13 and the upper electrode 14 includes an electrode film containing a ruthenium or ruthenium-alloy layer. In this embodiment, however, both the upper electrode 13 and the upper electrode 14 include an electrode film containing a ruthenium or ruthenium-alloy layer. In this embodiment, the same components as those of the first embodiment are denoted by the same reference numerals as those of the first embodiment, and therefore, explanation of them is omitted herein.

Figure 8A:
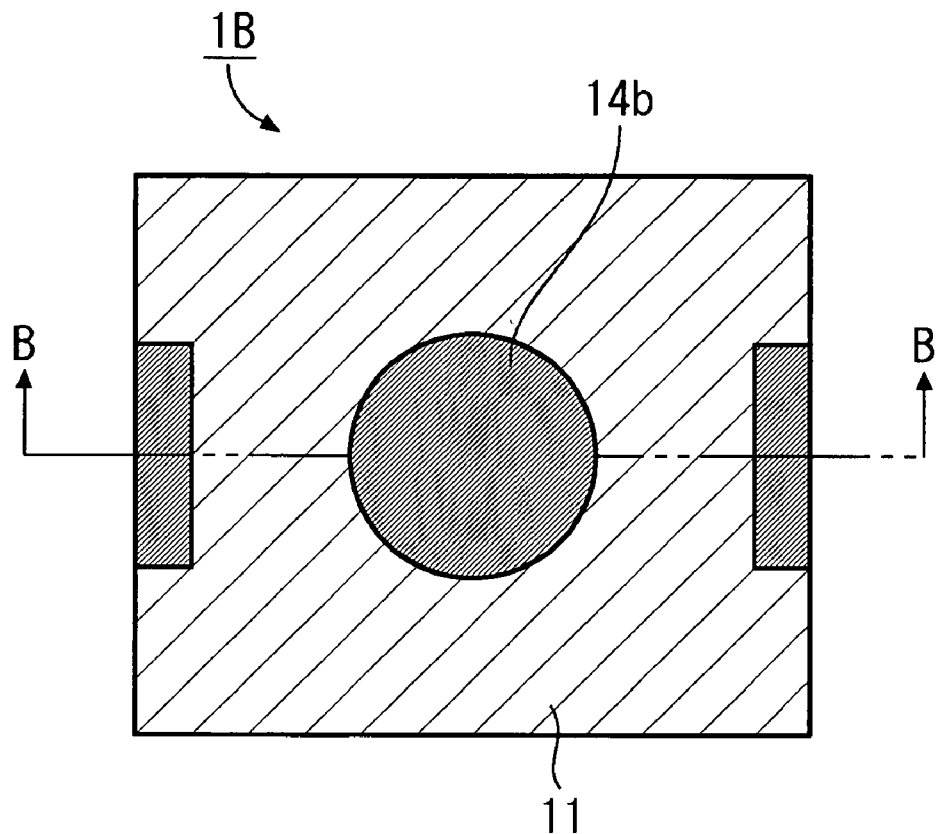
FIG. 8A is a plan view of a FBAR in accordance with a second embodiment of the present invention.
Figure 8B:
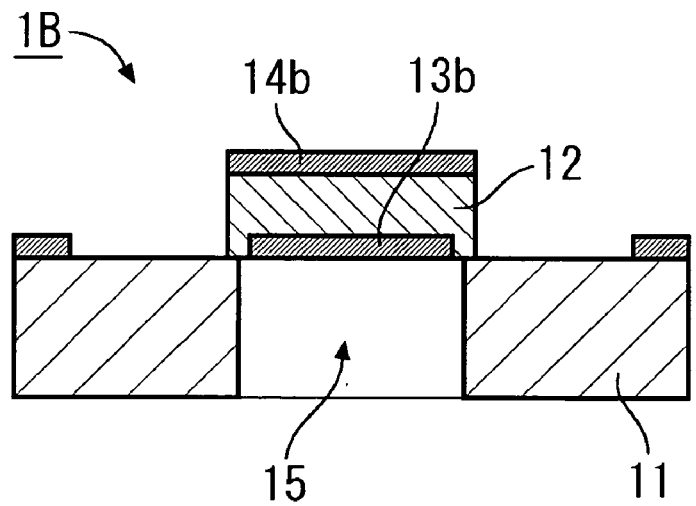
FIG. 8B is a section view of the FBAR, taken along the line B-B of FIG. 8A.

FIGS. 8A and 8B illustrate the structure of a FBAR 1B in accordance with this embodiment. FIG. 8A is a plan view of the FBAR 1B, and FIG. 8B is a section view of the FBAR 1B, taken along the line B-B of FIG. 8A.

As shown in FIGS. 8A and 8B, the FBAR 1B of this embodiment has the same structure as the FBAR 1A of the first embodiment, except that the lower electrode 13 and the upper electrode 14 are replaced with a lower electrode 13b and an upper electrode 14b that are formed with electrode films each containing a ruthenium or ruthenium-alloy layer.

With this structure, damage to the upper electrode 14b and the lower electrode 13b can be reduced when etching is performed to produce the piezoelectric thin film 12 (as well as the upper electrode 14b) and when etching is performed to form the cavity 15. Accordingly, a higher yield can be achieved.

Figure 9:
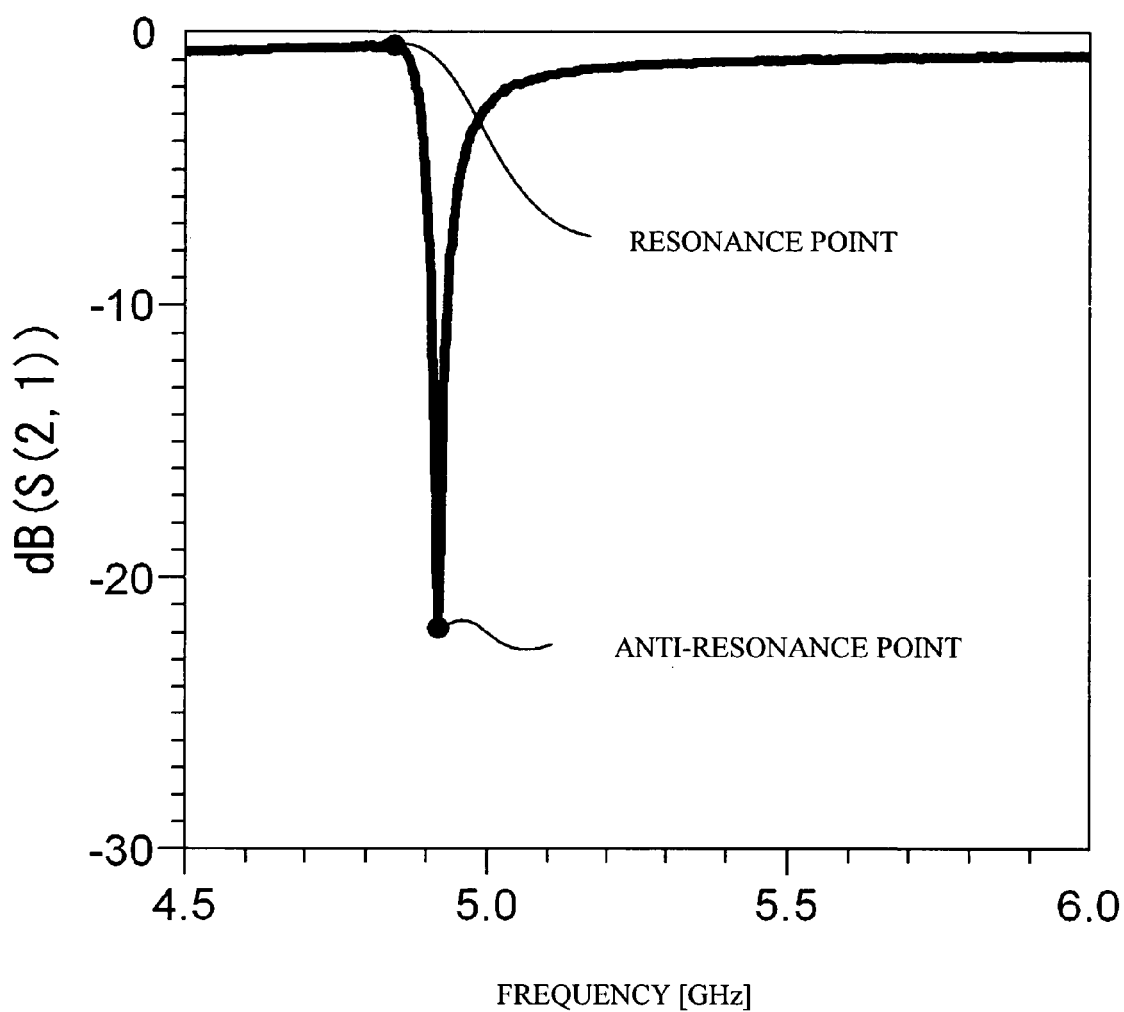
FIG. 9 shows the resonance characteristics of the FBAR in accordance with the second embodiment of the present invention.

FIG. 9 shows the resonance characteristics (S(2, 1) of the FBAR 1B of this embodiment. In the example shown in FIG. 9, the upper electrode 14b is formed with a 100 nm ruthenium film, the piezoelectric thin film 12 is formed with a 430 nm AlN film, and the lower electrode 13b is formed with a 100 nm ruthenium film.

As can be seen from FIG. 9, the FBAR 1B exhibits excellent resonance characteristics, having a degree of suppression of −3 dB or lower at the resonance points. The FBAR 1B also exhibits excellent anti-resonance characteristics, having a degree of suppression of −20 dB of higher at the anti-resonance point. In this manner, with the lower electrode 13b and the upper electrode 14b formed with electrode films each containing a ruthenium or ruthenium-alloy layer, a FBAR that exhibits excellent resonance characteristics and excellent anti-resonance characteristics can be obtained. With the electrode films each containing a ruthenium or ruthenium-alloy layer, loss can also be reduced as in the first embodiment.

The other aspects and the production method of this embodiment are the same as those of the first embodiment, and therefore, explanation of them is omitted herein.

Third Embodiment

Next, a third embodiment of the present invention is described in detail. In the above described first embodiment, at least one of the lower electrode 13 and the upper electrode 14 is formed with an electrode film containing a ruthenium or ruthenium-alloy layer. In this embodiment, on the other hand, a thin-film layer for preventing damage to the lower electrode 13 due to etching is provided for the lower electrode 13 on the side of the cavity 15. In this embodiment, the same components as those of the first embedment are denoted by the same reference numerals as those of the first embodiment, and explanation of them is omitted.

Figure 10A:
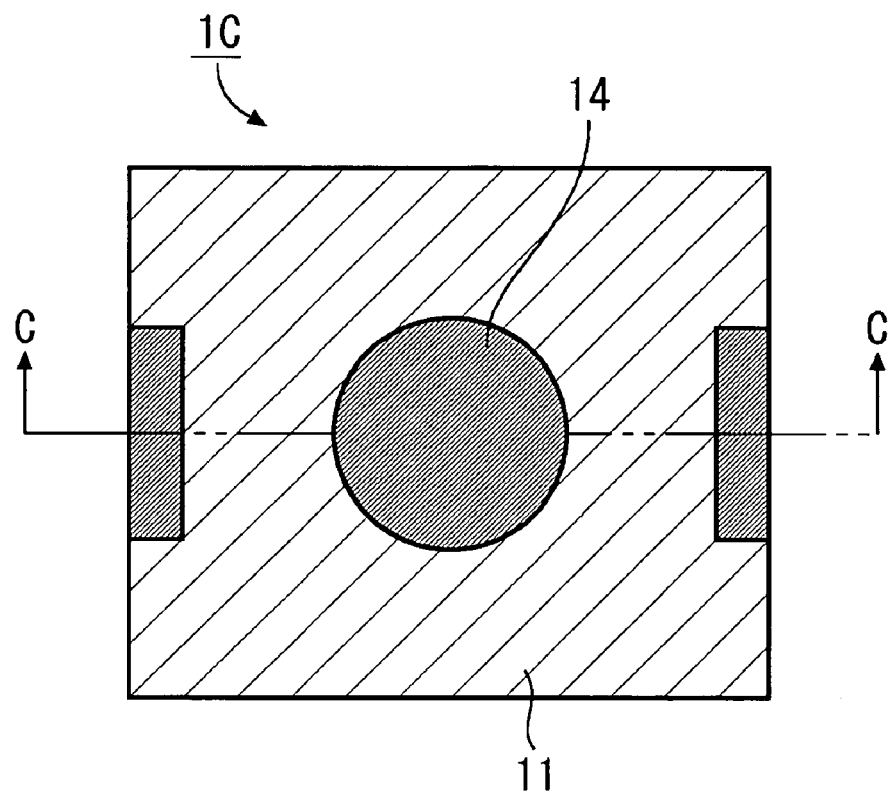
FIG. 10A is a plan view of a FBAR in accordance with a third embodiment of the present invention.
Figure 10B:
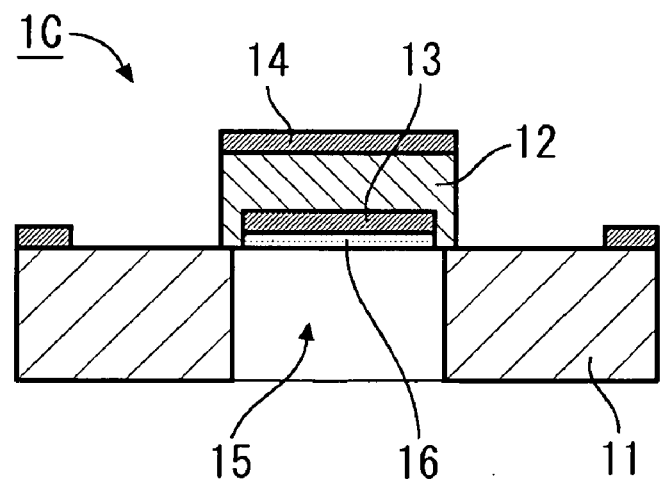
FIG. 10B is a section view of the FBAR, taken along the line C-C of FIG. 10A.

FIGS. 10A and 10B illustrate the structure of a FBAR 10C in accordance with this embodiment. FIG. 10A is a plan view of the FBAR 1C, and FIG. 10B is a section view of the FBAR 1C, taken along the line C-C of FIG. 10A.

As shown in FIGS. 10A and 10B, the FBAR 1C of this embodiment has the same structure as the FBAR 1A of the first embodiment, except that a thin-film layer 16 is formed under the lower electrode 13, i.e., on top of the cavity 15. With this structure, the lower electrode 13 is not exposed to the cavity 15, and damage to the lower electrode 13 caused by the etching to form the cavity 15 can be prevented. The other aspects of this embodiment are the same as those of the FBAR 1A of the first embodiment.

Example materials for the thin-film layer 16 include pure metals such as aluminum (Al), copper (Cu), and chromium (Cr), alloys such as aluminum alloy, copper alloy, and chromium alloy, oxides such as aluminum oxide, copper oxide, and chromium oxide, and nitrides such as aluminum nitride, copper nitride, and chromium nitride. However, the materials for the thin-film layer 16 are not limited to the above, and any other material may be employed as long as it exhibits sufficient resistance to etching with a fluorine-based gas. In the example case described below, the thin-film layer 16 is made of alumina ($Al_2O_3$).

With the above structure, damage to the lower electrode 13 due to the etching performed to form the cavity 15 can be certainly prevented. Accordingly, a higher yield can be achieved.

Next, a method of producing the FBAR 1C in accordance with this embodiment is described in detail. In the example case described below, the thin-film layer 16 is made of alumina, and the other aspects of the structure are the same as those of the structure shown in FIGS. 2A through 3C.

Figure 11A:
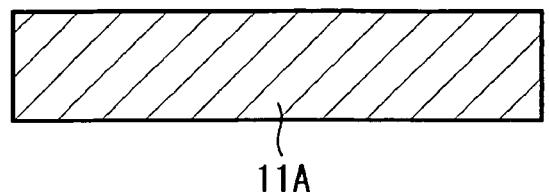
FIGS. 11A through 11E illustrate a method of producing the FBAR in accordance with the third embodiment of the present invention.
Figure 11B:
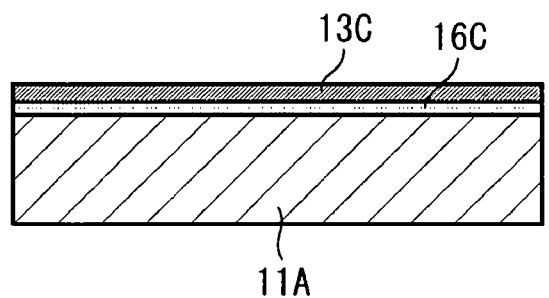

First, a silicon substrate 11A is prepared as shown in FIG. 11A. A thin-film layer 16C to be formed into the thin-film layer 16 by patterning and a conductive film 13C to be formed into the lower electrode 13 by patterning are formed on a principal surface of the silicon substrate 11A by a sputtering technique or the like, as shown in FIG. 11B. This thin-film layer 16C has a single-layer structure having a 50 nm alumina film formed on the silicon substrate 11A. The conductive film 13C has a single-layer structure having a 100 nm ruthenium film formed on the thin-film layer 16C.

Figure 11C:
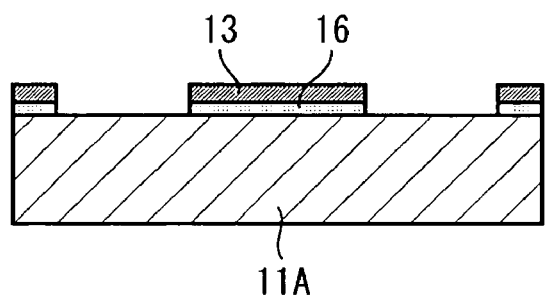

A resist film with a predetermined shape (to form the lower electrode 13 and the thin-film layer 16) is then formed on the conductive film 13C by a photolithography technique or the like, and patterning is performed thereon by dry etching or wet etching to form the thin-film layer 16 and the lower electrode 13 with the desired shapes, as shown in FIG. 11C. Here, other wiring patterns and a ground pattern may be formed at the same time. In the dry etching or wet etching, a fluorine-based gas or an acid-based chemical can be used as mentioned earlier.

Figure 11D:
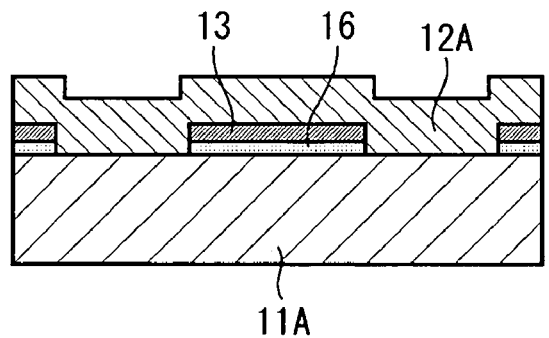
Figure 11E:
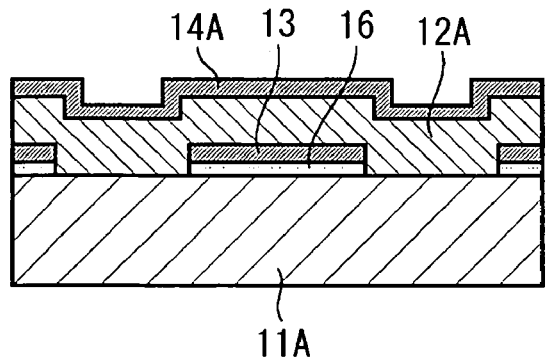

Next, a piezoelectric thin film 12A is formed on the lower electrode 13 and the silicon substrate 11A by a sputtering technique or the like, as shown in FIG. 11D. Further, a conductive layer 14A to be formed into the upper electrode 14 by patterning is formed on the piezoelectric thin film 12A by a sputtering technique or the like, as shown in FIG. 11E. The piezoelectric thin film 12A includes a 420 nm aluminum nitride (AlN) film, for example. The conductive layer 14A has a single-layer structure having a 100 nm ruthenium (Ru) film formed on the piezoelectric thin film 12A, for example.

Figure 12A:
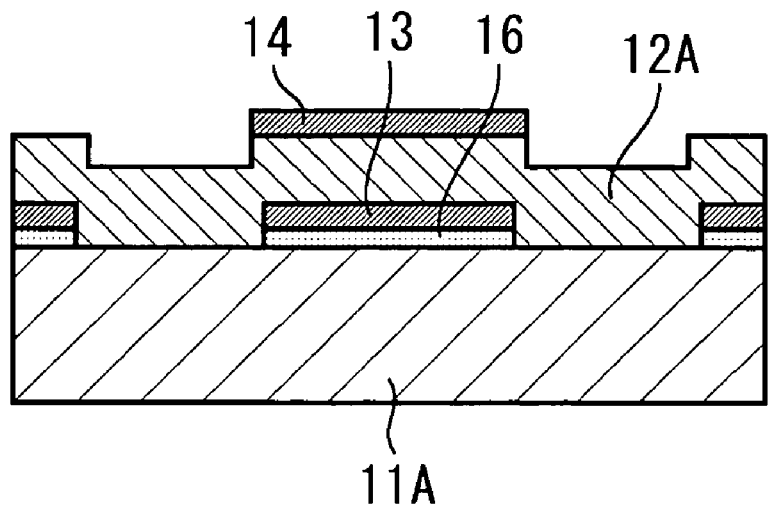
FIGS. 12A through 12C illustrate the method of producing the FBAR in accordance with the third embodiment of the present invention.
Figure 12B:
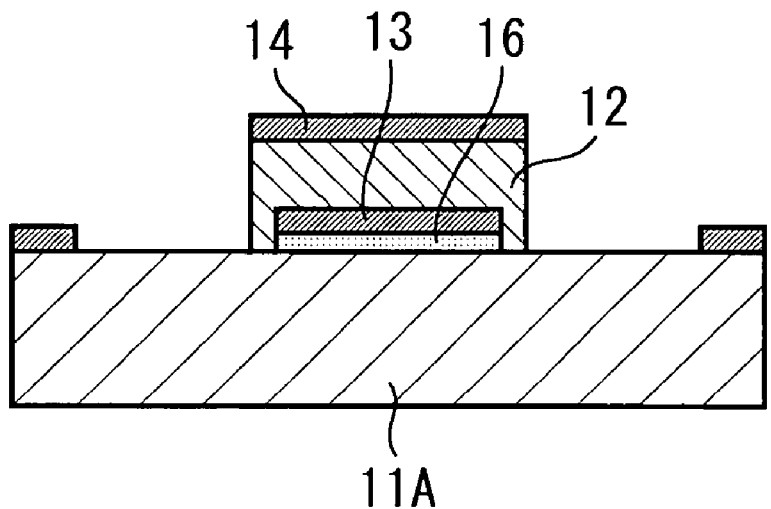

A resist film with a predetermined shape (to form the upper electrode 14 and the piezoelectric thin film 12) is then formed on the conductive layer 14A by a photolithography technique or the like, and patterning is performed by dry etching or wet etching to form the upper electrode 14 (see FIG. 12A) and the piezoelectric thin film 12 (see FIG. 12B) with the desired shapes. Here, a fluorine-based gas or an acid-based chemical can be used in the dry etching or wet etching as mentioned earlier. In this procedure, lift-off may be performed to form the upper electrode 14.

Figure 12C:
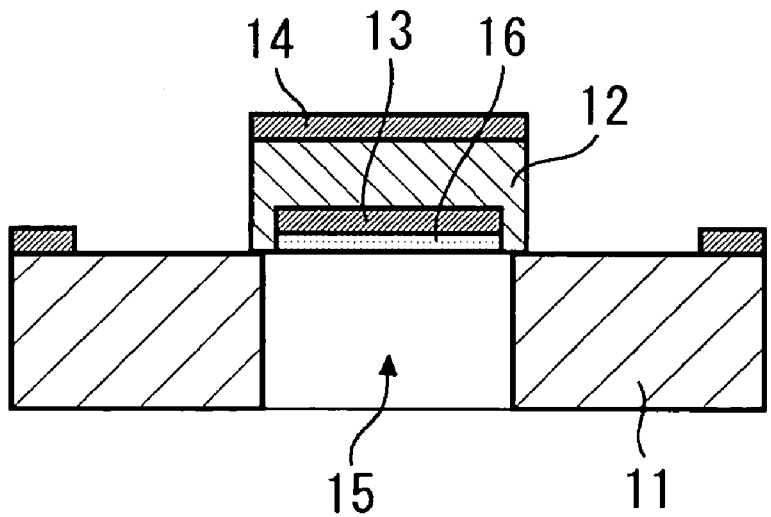

After a resonator including the thin-film layer 16, the lower electrode 13, the piezoelectric thin film 12, and the upper electrode 14 is formed in the above described manner, a resist film with a predetermined shape (to form the cavity 15) is formed on the bottom surface of the silicon substrate 11A by a photolithography technique or the like. Dry etching is then performed on the resist film to produce the substrate 11 with the cavity 11 formed therein. Thus, the FBAR 1C shown in FIGS. 10A, 10B, and 12C is obtained.

Figure 13:
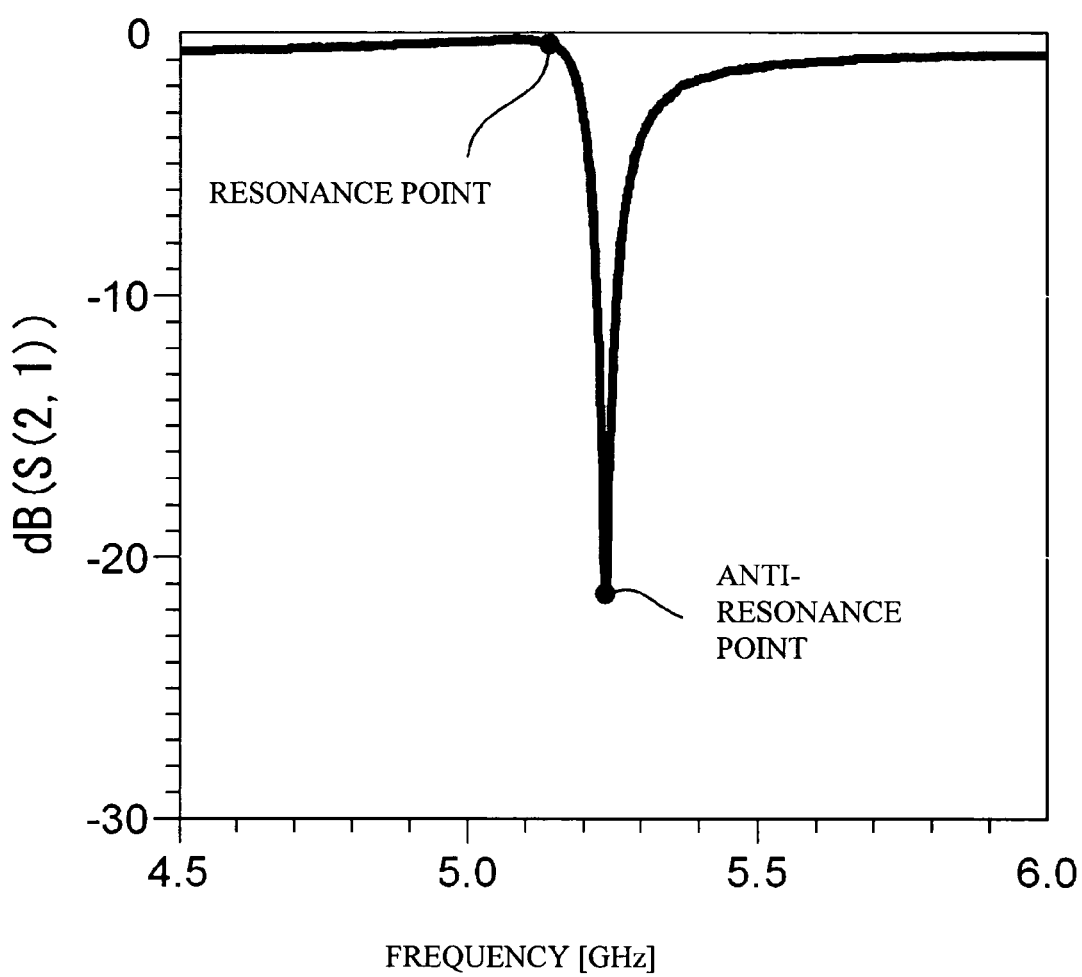
FIG. 13 shows the resonance characteristics of the FBAR in accordance with the third embodiment of the present invention.

FIG. 13 shows the resonance characteristics (S(2, 1) of the FBAR 1C of this embodiment. In the example shown in FIG. 13, the upper electrode 14 is formed with a 100 nm ruthenium film, the piezoelectric thin film 12 is formed with a 420 nm AlN film, the lower electrode 13 is formed with a 100 nm ruthenium film, and the thin-film layer 16 is formed with a 50 nm alumina film.

As can be seen from FIG. 13, the FBAR 1C exhibits excellent resonance characteristics, having a suppression degree of −3 dB or lower at the resonance points. The FBAR 1C also exhibits excellent anti-resonance characteristics, having a suppression degree of −20 dB of higher at the anti-resonance point. In this manner, the lower electrode 13 and the upper electrode 14 are formed with electrode films each containing a ruthenium or ruthenium-alloy layer, and the thin-film layer 16 for protecting the lower electrode 13 from etching is provided under the lower electrode 13. Thus, a FBAR that exhibits excellent resonance characteristics and excellent anti-resonance characteristics can be obtained. With the electrode films each containing a ruthenium or ruthenium-alloy layer, loss can also be reduced as in the first embodiment.

The other aspects and the production method of this embodiment are the same as those of the first embodiment, and therefore, explanation of them is omitted herein.

Fourth Embodiment

Next, the relationship between the elastic modulus of a ruthenium film employed for a lower electrode and/or an upper electrode and the degree of suppression at the attenuation pole is described in detail as a fourth embodiment of the present invention. In the example case described below, the elastic modulus of the ruthenium film forming the lower electrode 13b and the upper electrode 14b of the FBAR 1B of the second embodiment is varied.

Figure 14:
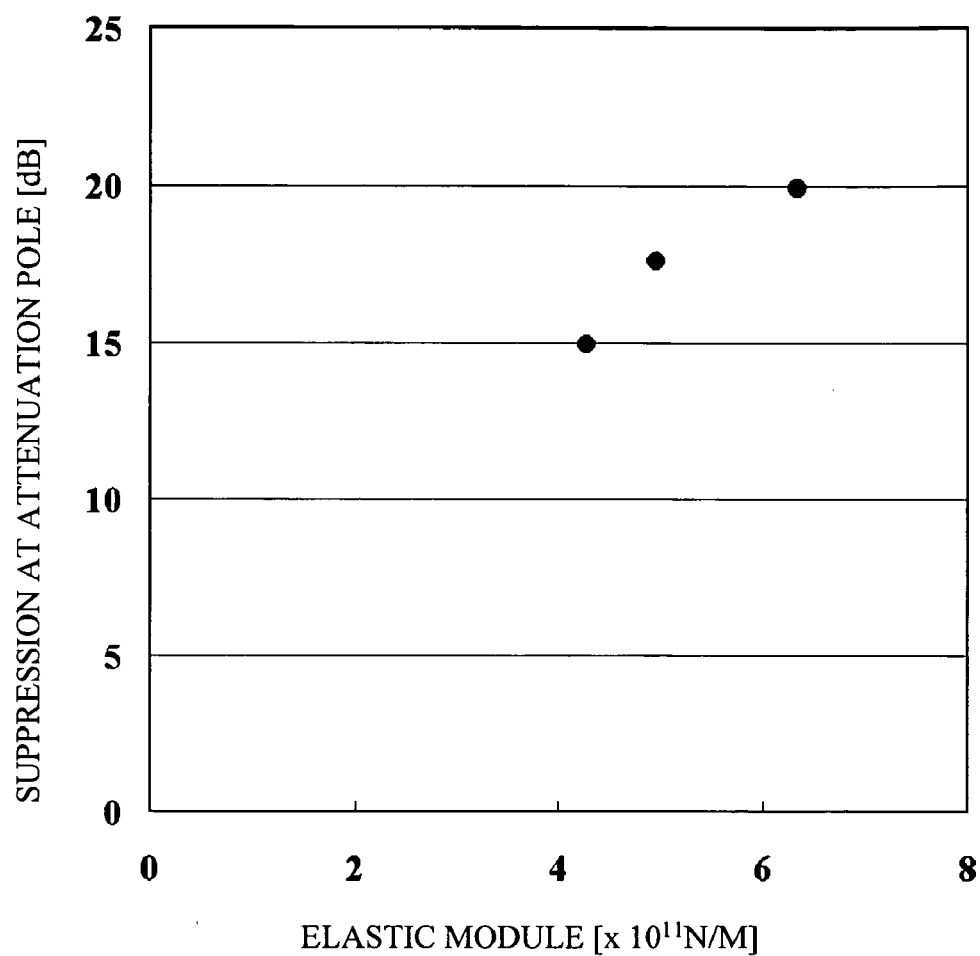
FIG. 14 is a graph representative of the relationship between the elastic modulus of each ruthenium film and the degree of suppression at the attenuation pole in a fourth embodiment of the present invention.

FIG. 14 is a graph showing the relationship between the elastic modulus of the ruthenium film and the degree of suppression at the attenuation pole. As is apparent from FIG. 14, the higher the elastic modulus of the ruthenium film, the higher the degree of suppression at the attenuation pole. Accordingly, when the lower electrode 13b and the upper electrode 14b have a higher elastic modulus, more preferable characteristics can be achieved.

The elastic modulus of the ruthenium film can be controlled by changing the conditions for forming the ruthenium film, and the step of producing the ruthenium film is the same as the procedure in accordance with the first embodiment.

The other aspects and the production procedures of this embodiment are the same as those of the first embodiment, and therefore, explanation of them is omitted herein.

Fifth Embodiment

Next, a fifth embodiment of the present invention is described in detail. In a case where the lower electrode 13 and/or the upper electrode 14 are formed with a ruthenium film, the internal stress of the ruthenium film affects the strength of the device (a FBAR or a filter that employs the FBAR). In the example case described below, the FBAR 1 of the first embodiment is used.

In an experiment conducted in accordance with this embodiment, the conditions for forming a ruthenium film were changed, and FBARs 1A including ruthenium films with various internal stress values as the lower electrode 13 and/or the upper electrode 14 were produced. Using the FBARs 1A, the relationship between the internal stress of each ruthenium film and the strength of the device was examined.

When an input signal of about 5 GHz was applied, most of the FBARs 1A each having a ruthenium film with an internal stress of 3 GPa or greater broke. Particularly, with a ruthenium film formed under the condition that the sputtering pressure was 0.5 Pa or lower, the device was more likely to break.

As is apparent from such a result, it is preferable to restrict the internal stress of a ruthenium or ruthenium-alloy film to 3 GPa or smaller, when the lower electrode and/or the upper electrode 14 are formed with an electrode film containing the ruthenium or ruthenium-alloy layer. By doing so, FBARs that are less likely to break can be obtained.

So as to control the internal stress of the lower electrode 13, it is also possible to form a thin-film layer under the lower electrode 13 (on the top of the cavity 15). This thin-film layer may be made of a pure metal such as aluminum (Al), copper (Cu), or chromium (Cr), an alloy containing aluminum (Al), copper (Cu), or chromium (Cr), an oxide containing aluminum (Al), copper (Cu), or chromium (Cr), or a nitride containing aluminum (Al), copper (Cu), or chromium (Cr), for example. With such a thin-film layer, the same effects as with the case where the internal stress of the lower electrode 13 is restricted to 3 GPa or smaller can be achieved.

The other aspects and the production method of the fifth embodiment are the same as those of the first embodiment, and therefore, explanation of them is omitted herein.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A film bulk acoustic resonator comprising:
   a piezoelectric thin film formed on a first surface of a substrate; and
   a lower electrode and an upper electrode arranged to sandwich the piezoelectric thin film,
   the piezoelectric thin film being made of aluminum nitride, and
   at least one of the lower electrode and the upper electrode being made of ruthenium or a ruthenium-alloy containing ruthenium as a main component,
   the lower electrode being directly exposed to a cavity formed below the lower electrode.

2. The film bulk acoustic resonator as claimed in claim 1, wherein the thin-film layer contains a pure metal such as aluminum (Al), copper (Cu), or chromium (Cr), an alloy containing aluminum (Al), copper (Cu), or chromium (Cr), an oxide containing aluminum (Al), copper (Cu), chromium (Cr), or a nitride containing aluminum (Al), copper (Cu), or chromium (Cr).

3. The film bulk acoustic resonator as claimed in claim 1, further comprising a multilayer film that is composed of at least two kinds of thin films laminated and includes the lower electrode.

4. The film bulk acoustic resonator as claimed in claim 1, wherein the aluminum nitride of the piezoelectric thin film has an orientation of (002) as a principal orientation axis.

5. The film bulk acoustic resonator as claimed in claim 1, wherein:
   the lower electrode contains a layer made of ruthenium or a ruthenium-alloy; and
   the layer made of ruthenium or a ruthenium alloy has an orientation of (002) as a principal orientation axis.

6. The film bulk acoustic resonator as claimed in claim 1, wherein the ratio of the total film thickness of the lower electrode and the upper electrode to the film thickness of the piezoelectric thin film is in the range of 1/12 to 1.

7. A method of producing a film bulk acoustic resonator, comprising the steps of:
   forming a lower electrode on a substrate;
   forming a piezoelectric thin film of aluminum nitride on the substrate in such a manner as to cover the lower electrode;
   forming an upper electrode on the piezoelectric thin film, and
   forming a cavity under the lower electrode such that the lower electrode is directly exposed to the cavity,
   the lower electrode being made of ruthenium or a ruthenium-alloy containing ruthenium as the main component.

8. The method as claimed in claim 7, wherein:
   the step of forming the lower electrode includes a step of forming the ruthenium or ruthenium-alloy layer having an orientation of (002) as a principal orientation axis; and
   the step of forming the piezoelectric thin film includes a step of forming the aluminum nitride film having an orientation of (002) as a principal orientation axis.

9. The method as claimed in claim 7, wherein the step of forming the thin-film layer includes a step of forming a layer containing a pure metal such as aluminum (Al), copper (Cu), or chromium (Cr), an alloy containing aluminum (Al), copper (Cu), or chromium (Cr), an oxide containing aluminum (Al), copper (Cu), or chromium (Cr), or a nitride containing aluminum (Al), copper (Cu), or chromium (Cr).

10. The method as claimed in claim 7, wherein the step of forming the lower electrode includes a step of forming a layer made of ruthenium or a ruthenium-alloy layer by a sputtering technique with a sputtering pressure of 0.5 Pa or higher.

* * * * *